United States Patent
Buehler et al.

(10) Patent No.: US 9,760,669 B2
(45) Date of Patent: Sep. 12, 2017

(54) CONGESTION MITIGATION BY WIRE ORDERING

(71) Applicant: International Business Machines Corporation, Armonk, NY (US)

(72) Inventors: Markus Buehler, Weil im Schoenbuch (DE); Diwesh Pandey, Bangalore (IN); Sven Peyer, Tuebingen (DE)

(73) Assignee: International Business Machines Corporation, Armonk, NY (US)

(*) Notice: Subject to any disclaimer, the term of this patent is extended or adjusted under 35 U.S.C. 154(b) by 19 days.

(21) Appl. No.: 14/937,995

(22) Filed: Nov. 11, 2015

(65) Prior Publication Data

US 2017/0132351 A1  May 11, 2017

(51) Int. Cl.
*G06F 17/50* (2006.01)

(52) U.S. Cl.
CPC ...... *G06F 17/5077* (2013.01); *G06F 17/5072* (2013.01); *G06F 17/5081* (2013.01)

(58) Field of Classification Search
CPC ............. G06F 17/5081; G06F 17/5077; G06F 17/5072
USPC ....... 716/111, 122, 123, 131, 124, 125, 129; 703/15
See application file for complete search history.

(56) References Cited

U.S. PATENT DOCUMENTS

| 7,725,868 | B1* | 5/2010 | Verma ................. G06F 17/5027 716/128 |
| 8,370,782 | B2 | 2/2013 | Alpert et al. |
| 8,601,425 | B2 | 12/2013 | Alpert et al. |
| 8,671,368 | B1* | 3/2014 | Salowe ............... G06F 17/5077 716/126 |
| 8,719,750 | B1* | 5/2014 | Balzli, Jr. .......... G06F 17/5072 716/113 |
| 8,769,467 | B2 | 7/2014 | Chyan et al. |
| 8,769,468 | B1* | 7/2014 | Alpert .................. G06F 17/505 716/130 |
| 2007/0136714 | A1* | 6/2007 | Cohn .................. G06F 17/5077 716/54 |
| 2008/0301612 | A1* | 12/2008 | Buehler .............. G06F 17/5072 716/122 |
| 2011/0107337 | A1* | 5/2011 | Cambonie ........... G06F 15/7867 718/102 |
| 2014/0165019 | A1 | 6/2014 | Kalpat et al. |
| 2014/0331196 | A1 | 11/2014 | Helvey |

OTHER PUBLICATIONS

Cho et al., "Track Routing and Optimization for Yield", IEEE Transactions on Computer-Aided Design of Integrated Circuits and Systems, vol. 27, No. 5, May 2008, pp. 872-882.

(Continued)

*Primary Examiner* — Phallaka Kik
(74) *Attorney, Agent, or Firm* — L. Jeffrey Kelly

(57) ABSTRACT

A method, computer program product, and system for rerouting wires based on wire size and spacing requirements including partitioning a chip into a plurality of global routing tiles, assigning a set of wires to one or more of the plurality of global routing tiles, sorting the set of wires into one or more groups based on line spacing requirements for wires of the set of wires, each of the one or more groups includes one or more wires with a common line spacing requirement, and organizing the one or more groups in a numeric order based on the common line spacing requirement of each group.

15 Claims, 8 Drawing Sheets

(56) References Cited

OTHER PUBLICATIONS

Hu et al., "A Survey on Multi-net Global Routing for Integrated Circuits", This work is supported in part by the NSF under contract CCR-9800992 and the SRC under contract 98-DJ-609, Integration, the VLSI Journal, 2001, 68 pages.

Kay et al., "Wire Packing—A Strong Formulation of Crosstalk-Aware Chip-Level Track/Layer Assignment with an Efficient Integer Programming Solution", IEEE Transactions on Computer-Aided Design of Integrated Circuits and Systems, vol. 20, No. 5, May 2001, Short Papers, pp. 672-679.

Lee et al., "Minimizing Critical Area on Gridless Wire Ordering, Sizing and Spacing" Journal of Information Science and Engineering, vol. 30, 157-177 (2014), pp. 157-177.

* cited by examiner

FIG. 5

CONGESTION MITIGATION BY WIRE ORDERING

BACKGROUND

The present invention relates generally to a method, system, and computer program product for designing an integrated circuit (IC), and more particularly, to a method, system, and computer program product for solving congestion problems in an IC design by adjusting a wire order during routing.

Modern day electronics include components that use ICs. ICs are electronic circuits formed using Silicon as a substrate and by adding impurities to form solid-state electronic devices, such as transistors, diodes, and resistors. Commonly known as a "chip," an IC is generally encased in hard plastic. The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as by amplifying, filtering, or mixing the signals, and produce an analog or digital output. Generally, any type of circuit can be designed as an IC.

Logical synthesis, physical synthesis, and generation of a routed and timing-closed design are some of the functions of an IC design software tool. Logical synthesis is the process of designing the logical operation that is to be achieved by a circuit. Physical synthesis is the mapping, translating, or integration of that logical synthesis to the physical design components, such as logic gate and buffer circuits. Routing and timing-closed design is the design produced by adjusting the wire routings and component placements in a design so that the design meets certain design criteria such as delay or slew of signals, wire length restrictions, or crosstalk concerns.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry.

SUMMARY

Embodiments of the present invention disclose a method, computer program product, and system for rerouting wires based on wire size and spacing requirements including partitioning a chip into a plurality of global routing tiles, assigning a set of wires to one or more of the plurality of global routing tiles, sorting the set of wires into one or more groups based on line spacing requirements for wires of the set of wires, each of the one or more groups includes one or more wires with a common line spacing requirement, and organizing the one or more groups in a numeric order based on the common line spacing requirement of each group.

BRIEF DESCRIPTION OF THE DRAWINGS

The following detailed description, given by way of example and not intended to limit the invention solely thereto, will best be appreciated in conjunction with the accompanying drawings, in which:

FIG. 5 illustrates a graphical illustration of the rerouting method, in accordance with an exemplary embodiment;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to a method, system, and computer program product for designing an integrated circuit (IC), and more particularly, to a method, system, and computer program product for solving congestion problems in an IC design by adjusting the wire order during routing. One way to adjust the wire order during routing is to reroute or reorder wires based on wire size and spacing requirements. One embodiment by which to reroute or reorder wires based on wire size and spacing requirements during routing is described in detail below by referring to the accompanying drawings in FIGS. 1 to 8. Those skilled in the art will readily appreciate that the detailed description given herein with respect to these figures is for explanatory purposes as the invention extends beyond these limited embodiments.

Figure 1:
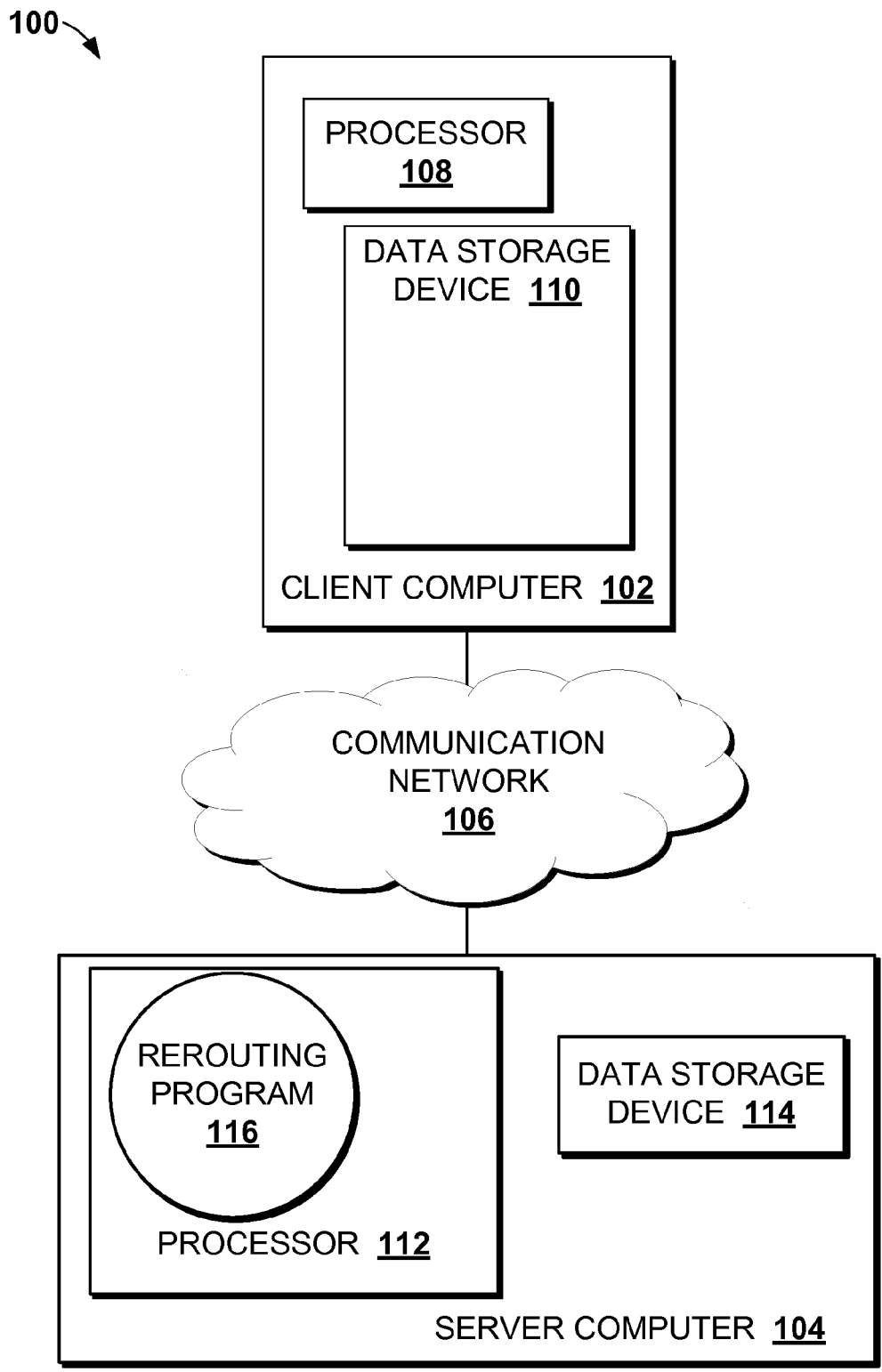
FIG. 1 is a functional block diagram illustrating a system 100 for rerouting wires based on wire size and spacing requirements, in accordance with an exemplary embodiment.

Referring now to FIG. 1, a functional block diagram illustrating a system 100 for rerouting wires based on wire size and spacing requirements, in accordance with an embodiment of the present invention is shown. The system 100 may include a client computer 102 and a server computer 104. The client computer 102 may communicate with the server computer 104 via a communications network 106 (hereinafter "network"). The client computer 102 may include a processor 108, a data storage device 110, and is enabled to interface with a user and communicate with the server computer 104. The server computer 104 may also include a processor 112 and a data storage device 114 that is enabled to run a rerouting program 116. In an embodiment, the client computer 102 may operate as an input device including a user interface while the rerouting program 116 may run primarily on the server computer 104. In an alternative embodiment, the rerouting program 116 may run primarily on the client computer 102 while the server computer 104 may be used for processing and storage of data used by the rerouting program 116. It should be noted that the rerouting program 116 may be a standalone program or may be integrated into a larger IC design program as part of the IC design tool software.

It should be noted, however, that processing for the rerouting program 116 may, in some instances be shared amongst the client computer 102 and the server computer 104 in any ratio. In another embodiment, the rerouting program 116 may operate on more than one server computer 104, client computer 102, or some combination of server computers 104 and client computers 102, for example, a plurality of client computers 102 communicating across the network 106 with a single server computer 104.

The network 106 may include wired connections, wireless connections, fiber optic connections, or some combination thereof. In general, the network 106 can be any combination of connections and protocols that will support communications between the client computer 102 and the server computer 104. The network 106 may include various types of networks, such as, for example, a local area network (LAN), a wide area network (WAN) such as the Internet, a telecommunication network, a wireless network, a public switched network and/or a satellite network.

In various embodiments, the client computer 102 and/or the server computer 104 may be, for example, a laptop computer, tablet computer, netbook computer, personal computer (PC), a desktop computer, a personal digital assistant (PDA), a smart phone, a mobile device, or any programmable electronic device capable of communicating with the server computer 104 via the network 106. As described below with reference to FIG. 9, the client computer 102 and the server computer 104 may each include internal and external components.

In an embodiment, the system 100 may include any number of client computers 102 and/or server computers 104; however only one of each is shown for illustrative purposes only. It may be appreciated that FIG. 1 provides only an illustration of one implementation and does not imply any limitations with regard to the environments in which different embodiments may be implemented. Many modifications to the depicted environments may be made based on design and implementation requirements.

The rerouting program 116 and associated methods are described and explained in further detail below with reference to FIGS. 2-8.

Figure 2:
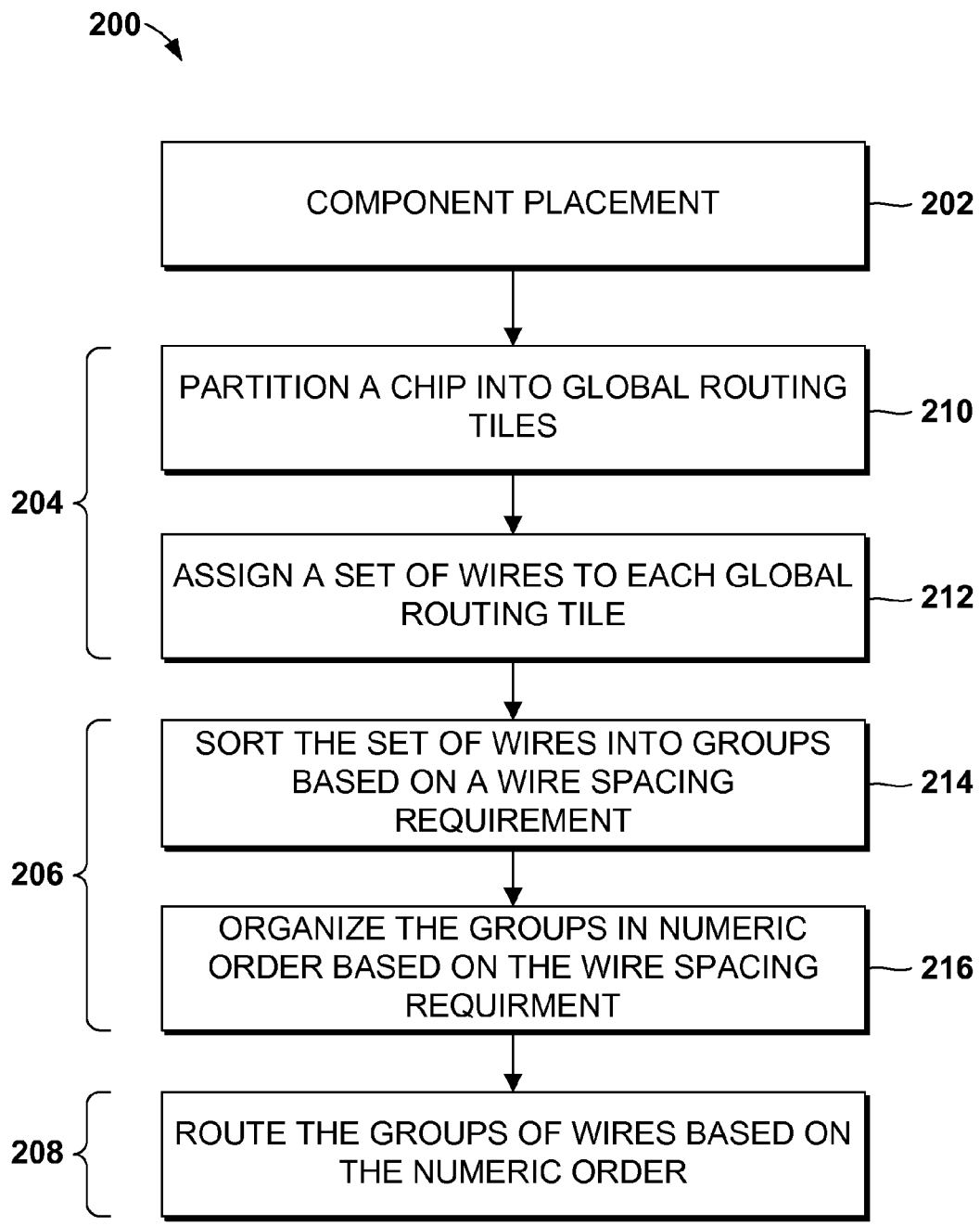
FIG. 2 is a flowchart depicting operational steps of an IC design method within the system of FIG. 1, in accordance with an exemplary embodiment.

Referring now to FIG. 2, an IC design method 200 is shown in accordance with an embodiment of the present invention. The IC design method 200 as described herein may generally include four steps or phases; however, it may contain addition steps or phases which have been omitted for brevity. The IC design method 200 may generally include a component placement step 202, a global routing step 204, a rerouting step 206, and a detailed routing step 208. In all cases, the IC design method 200 and its respective steps may be carried out with the objective to meet all the design parameters or constraints of a particular IC design or chip. It should be noted that the IC design method 200 may, in some contexts, be referred to as electronic design automation or EDA. Further, the IC design method 200 may be embodied or packaged in the form of an IC design software tool. In an embodiment, all or some of the steps of the IC design method 200 may be carried out by the rerouting program 116. In another embodiment, all or some of the steps of the IC design method 200 may be carried out by the IC design tool software, which may include the rerouting program 116.

During the component placement step 202, the IC design software tool manipulates IC components at the components level, or blocks of components level to generate a component layout. The IC components may include semiconductor devices, such as, for example, field effect transistors and various other known semiconductor devices. Typical placement objectives may include minimizing total wirelength, minimizing congestion, and minimizing power consumption.

Once a placer has performed the placement function during the component placement step 202, a router attempts to connect the IC components during a routing step. Routing generally may be split into global routing (204) and detailed routing (206), as described in further detail below.

During the global routing step 204, an approximate path or course is determined for the electrical connections or interconnections between the various IC components of a particular IC design. A router is a component of an IC design software tool that performs the routing function while attempting to meet certain design criteria, such as, for example, delay, wire length, crosstalk, or other known criteria. For example, if a particular design criteria calls for no more than five wires in a given area, the router attempts to honor that restriction in configuring the wiring. Such limitations on the wiring are a type of design constraints and are called congestion constraints. Other types of design constraints may include, for example, blocked areas or blockages—areas where wires may not be routed. Congestion remains a difficult and challenging problem for circuit designers. Congestion can lead to connectivity failure. Because global routers conduct routing optimization at a very coarse level, they are not typically optimized to address pattern-specific routing due to modeling characteristics and runtime impact.

More specifically, routing may refer to a process of connecting the pins of various IC components after placement (202). In other words, placement results in a rendering of the components as being located in certain positions in the IC design, where routing results in a rendering of how the metal layers would be populated with the electrical connections consistent with that placement.

The electrical connections between the various components of an IC design may generally be referred to as nets. More specifically, a net may refer to a collection of interconnections among a group of components. In general, a wire is any electrical connection between two components, and may be formed using a metallic materials or others such as fiber optics and carbon nanotubes that conduct electricity. A wire forms a segment of a net. A wire can be designed to take any one of the several available paths in an IC design. Placement of a wire on a certain path, or track, is a part of routing. In general, all tracks of a single metal layer run parallel to each other and tracks of adjacent metal layers may typically run perpendicular to each other. Thus, a typical IC design layout may have tracks running from left to right in one metal layer and tracks running from top to bottom in another metal layer. It should be noted however, that for purposes of this description further reference to a wire or routing a wire may equally apply to a net or routing a net.

A global router partitions a routing region of the IC design into global tiles (hereinafter "tiles") and attempts to route wires through the tiles such that no one tile overflows its capacity, at step 210. Stated differently, global routing may refer to the process of connecting one tile to other tiles. A tile is merely a portion of the routing region. One way to define the tiles in the routing region is to overlay a grid of imaginary vertical and horizontal lines on the design, and define each portion of the routing region bound by the horizontal and the vertical lines as tile. Typically, the tiles will have a predetermined number of tracks, or spaces, in which a wire may be routed. Imposing such a grid on an IC design abstracts the global routing step 204 away from the actual wire implementation and gives a more mathematical representation of the task. A single wire may typically span one or more tiles.

Also during global routing (204), wires may then be assigned to each tile, at step 212. In general, a set of wires may be assigned to each global tile based on the design objectives and congestion constraints mentioned above.

After wires are assigned to a single tile during the global routing step 204 and before they are assigned to specific tracks during the detailed routing step 208, the wires are reordered during the rerouting step 206. Embodiments of the present invention address congestion by rerouting or reordering wires of a single tile and order them in specific patterns. More specifically, the specific order in which wires of a single tile are assigned in by the global router can be manipulated based on their respective wire size and spacing requirements specifically to reduce congestion.

Today's chips heavily use a broad spectrum of high performance wirecodes in order to meet challenging constraints. Each wirecode includes a wire size or line width followed by a line spacing requirement. For example, a wirecode of W20S15 describes a wire with a 2.0× width and a 1.5× spacing requirement. That is, a wire with a W20S15 wirecode will have a width two times a default wire width and a spacing requirement 1.5 times a default spacing requirement. The line width and its respective spacing requirement may be chosen based on the wires function and associated design constraints. Wires and nets in a particular IC design will have a variety of wirecodes. Stated differently, a particular IC design will have wires with varying widths and varying spacing requirements. Therefore, one or more spaces may be associated with each wire. It should be noted that for purposes of this description reference to wire size may include line width.

First, in an embodiment, the set of wires assigned to a particular tile during global routing may be sorted into groups based on their respective wire spacing requirements at step 214. Wires of the set with the same spacing requirement will be grouped together, and each group represents wires having a common spacing requirement. In an embodiment, a single group may include wires with varying widths or size but all have a common spacing requirement. For example, the set of wires may be sorted into three groups, each group having a different spacing requirement. For example, one group may include wires with the following wirecodes: W10S20, W15S20, and W20S20.

Next, the groups may be organized in numeric order based on the wire spacing requirement of each group, at step 216. For example, the groups may be organized in order form largest spacing requirement to smallest spacing requirement, or vice versa.

In an embodiment, the groups may be organized in descending order, from left to right, with respect to the tracks of a particular tile. In such cases, the group of wires with the largest space requirement will be first on the left side of the tile and the group of wires with the smallest space requirement will be last on the right side of the tile. It should be noted that groups organized from left to right, or vice versa may in fact apply to a single metal layer design having tracks running from top to bottom. Similarly, groups organized from top to bottom, or vice versa may in fact apply to a single metal layer design having tracks running from left to right.

Alternatively, for example, the groups may be organized in ascending order, from left to right, with respect to the tracks of a particular tile. In such cases, the group of wires with the smallest space requirement will be first at the left side of the tile and the group of wires with the largest space requirement will be at the right side of the tile. Whether the groups are organized in descending or ascending order, their particular order within each group is not critical. Therefore, ordering of the groups is critical whereas ordering of individual wires is not critical. The above scenarios are merely for illustration and are not intended to be limiting.

Therefore, wires having the same spacing requirements will be routed next to each other in order to use the design space efficiently. It should be noted that track assignment remains undefined and the specific order of the wires within each group remain undefined. In other words the rerouting step 206 provides a wire sequence based on their spacing requirements to allow for efficient packing of wires without defining in which order individual wires with the same spacing requirement are placed.

In an alternative embodiment, the set of wires assigned to a particular tile during global routing may be sorted into groups based on their respective wire spacing requirements and their respective wire size, at step 214. Wires of the set with the same spacing requirement and the same wire size will be grouped together. Each group represents wires having a common spacing requirement and a common wire size. In an embodiment, a single groups may include wires with varying widths or size but all have a common spacing requirement. For example, the set of wires may be sorted into three groups, each group having a different spacing requirement and a different wires size. For example, each group may include only wires with a W10S20 wirecode.

Next, according to the alternative embodiment, the groups may be organized in numeric order based on the wire spacing requirement and wire size of each group, at step 216. For example, the groups may be organized in order form largest spacing requirement and wire size to smallest spacing requirement and wire size, or vice versa. The groups may be organized in ascending or descending order as described above.

The rerouting step 206 is described herein as an intermediate step between the global routing step 204 and the detailed routing step 208; however, it may alternatively be incorporated into the IC design method 200 in any logical configuration. For example, the rerouting step 206, as described above, may be integrated into the global routing step 204.

Finally, after the tiles have been defined during global routing (204) and the wires have been sorted and organized during rerouting (206), they may each be assigned to a specific track during the detailed routing step 208. In general, detailed routing is accomplished tile-by-tile by a router as is well known to persons of ordinary skill in the art. A common detailed routing technique is rip-up and reroute. In the present example, the detailed router proceeds with detailed routing based on the numeric order of the groups.

Figure 3:
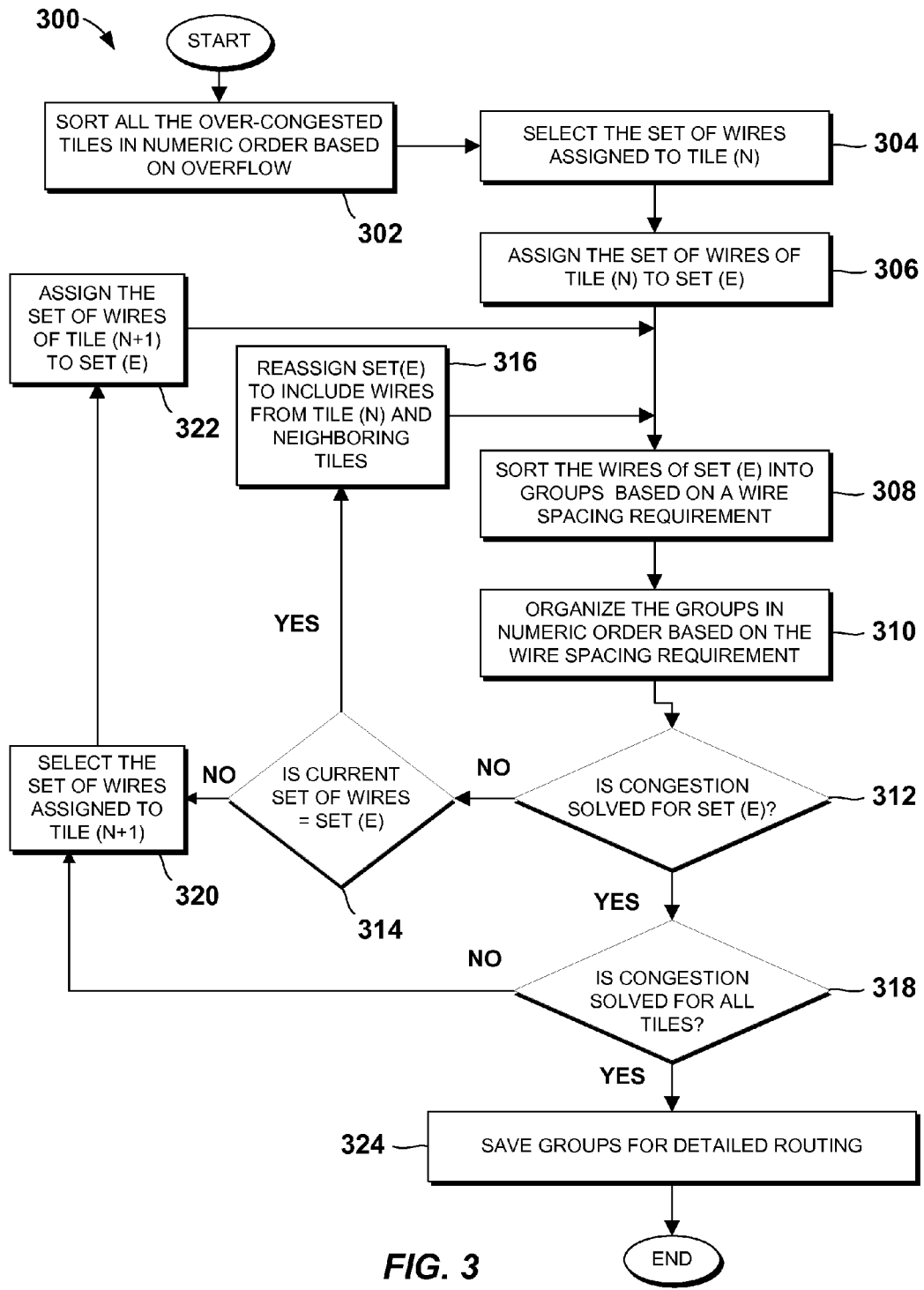
FIG. 3 is a flowchart depicting operational steps of a rerouting method, in accordance with an exemplary embodiment.

Referring now to FIG. 3, a rerouting method 300 is shown in accordance with an embodiment of the present invention. As previously described, the rerouting method 300 may be carried out after or during global routing but before detailed routing; however, the present example should not be limited to such an implementation. The rerouting method 300 may be understood as an embodiment of the rerouting step 206 of FIG. 2 described above.

First, tiles that are over-congested are distinguished from tiles that are not over-congested, and the over-congested tiles are then sorted in numeric order base on overflow, at step 302. In doing so, a relationship between a particular tile's demand in view of it tile's capacity it established. More specifically, the overflow of a particular tile is equal to its demand minus its capacity. A tile's demand is the number of wires allocated or assigned to that particular tile during global routing. A tile's capacity is the number of tracks or spaces available to route wires. After global routing (204), the tracks of each tile will be occupied by wires or reserved as a space to comply with the respective spacing requirements of the wires. No overflow exists with respect to a particular tile when its demand is less than its capacity; however, overflow occurs when its demand exceeds its capacity. As such, a tile may be considered over-congested when overflow occurs and may not be considered over-congested when no overflow occurs. In some instances, no overflow occurs and extra tracks may exist which are neither occupied by a wire nor reserved as a space. In other instances, overflow occurs and no extra tracks exist.

The over-congested tiles are then sorted in numeric order based on overflow. For example, the over-congested tiles may be sorted in order from largest overflow to smallest overflow, or vice versa. In an embodiment, the over-congested tiles may be sorted in descending order. In such cases, the over-congested tiles with the largest overflow will be first and the over-congested tiles with the smallest overflow will be last. Alternatively, the over-congested tiles may be sorted in ascending order with the smallest overflow first and the largest overflow last.

Next, the set of wires assigned to a tile (N) during global routing (204) are selected. Tile (N) represents the first tile selected from the sub-set of over-congested tiles. Tile (N) may have either the smallest or largest overflow. It may be preferable to select the over-congested tile with the largest overflow, or the most over-congested tile as tile (N). The set of wires assigned to tile (N) are then defined as set (E), at step 306.

The wires of set (E) may then be sorted into groups based on a wire size requirement, at step 308. The wires of set (E) are sorted according to the rerouting step 206 described above with reference to FIG. 2.

The groups may then be organized in numeric order based on the wire size requirement, at step 310. The groups are organized according to the rerouting step 206 described above with reference to FIG. 2.

The rerouting method 300 may then check whether congestion is solved for the wires of set (E), at step 312. More specifically, the rerouting method 300 may check whether all wires of set (E) can be routed. Stated differently, the rerouting method 300 may check whether enough tracks exist in the tile (N) to route all of the wires of set (E).

If congestion is not solved for the wires of set (E), at step 312, the rerouting method 300 may then check whether the current set of wires is equal to set (E), at step 314. If the current set of wires is equal to set (E), at step 314, the rerouting method 300 may then reassign a new set of wire to set (E), at step 316. The new set (E) may include wires from additional over-congested tiles. The additional over-congested tiles may be selected from any over-congested tiles neighboring tile (N). In an embodiment, the additional over-congested tiles may include neighboring tiles to those tiles which immediately neighbor tile (N). In an embodiment, set (E) may be re-assigned to include wires of the neighboring tiles in any direction, for example, opposite sides of tile (N). Therefore, the congestion problem is expanded and addressed with respect to multiple tiles and their respective wires. Doing so, increases the number of wires (i.e. the demand), increases the number of tracks (i.e. the capacity) in an attempt to address overflow and solve congestion. Once set (E) is re-assigned to include wires from additional tiles, the wires of new set (E) may then be sorted into groups and the groups organized in numeric order based on the wire size requirement, at steps 308 and 310. The above loop may preferably repeat until congestion is solved for the wires of the set (E), at step 312, or a stopping criterion is met, for example, a predetermined number of iterations.

If congestion is solved for the wires of set (E), at step 312, the rerouting method 300 may then check whether congestion is solved for all the over-congested tiles, at step 318. If congestion is solved for all the over-congested tiles, at step 318, the rerouting method 300 may then save the groups of step 310 and pass them to the detailed routing step 208. If the is not solved for all the over-congested tiles, at step 318, then the rerouting method 300 may proceed with selecting the wires of tile (N+1) or the next tile in the sub-set of over-congested tiles, at step 320.

Similarly, if congestion is not solved for the wires of set (E), at step 312 and the current set of wires is not equal to set (E), at step 314, then the rerouting method 300 may proceed with selecting the wires of tile (N+1) or the next tile in the sub-set of over-congested tiles, at step 320. After selecting the wires of tile (N+1), at step 320, the rerouting method 300 may assign the wires of tile (N+1) to set (E), at step 322. Once set (E) is re-assigned to include the wires of tile (N+1), the wires of new set (E) may then be sorted into groups and the groups organized in numeric order based on the wire size requirement, at steps 308 and 310 Like above, this loop may preferably repeat until congestion is solved for all the tiles, at step 312, or a stopping criterion is met, for example, a predetermined number of iterations.

Finally, if congestion is solved for the all the tiles, at step 318, the groups of wires from step 308 are saved for subsequent processing, at step 324. In an embodiment, the save groups may be transmitted to a detailed router for detailed routing (208), as is known to persons having ordinary skill in the art.

Figure 4:
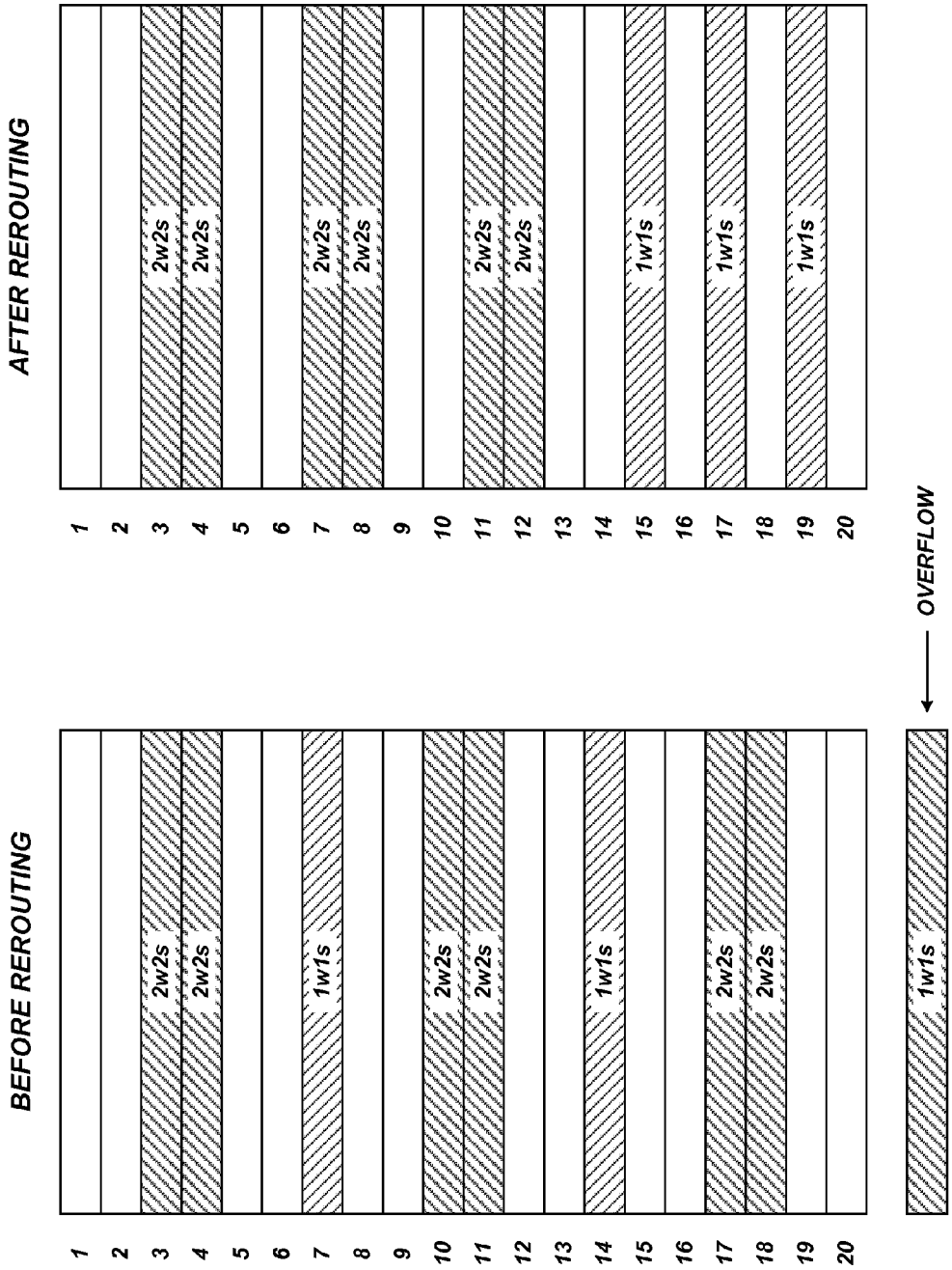
FIG. 4 illustrates a graphical illustration of the rerouting method, in accordance with an exemplary embodiment.

Referring now to FIG. 4, a graphical illustration of how the rerouting method 300 can address over-congestion is shown, in accordance with an embodiment of the present invention. In the present example, a single tile with a capacity of 20 wires is depicted before and after rerouting (206). Six wires are assigned to the tile of the present example, of which three have a W20S20 wirecode and three have a W10S10 wirecode. Before rerouting, as depicted on the left hand side of the figure, the tile is over-congested with an overflow of 1 wire. After rerouting, as depicted on the right hand side of the figure, the tile is no longer over-congested and all the wires assigned to this particular tile may be routed.

Before rerouting, the six wires were organized and routed in a random order irrespective of their width or spacing requirements. More specifically, W10S10 wires alternate with W20S20 wires. In the present case, this random order results in the tile being over-congested. After rerouting, the W20S20 wires are grouped and routed together, and the W10S10 wires are grouped and routed together, according to the techniques described in detail above with reference to FIGS. 2 and 3. In the present example, the W20S20 wires are routed first, from top-to-bottom, and the W10S10 wires are routed next; however, as in the above examples, the order in which each group of wires is routed is not critical, and furthermore, the specific order of individual wires within each group is also not critical. As illustrated, all the wires assigned to this particular tile may be routed and the over-congestion is solved.

Figure 5:
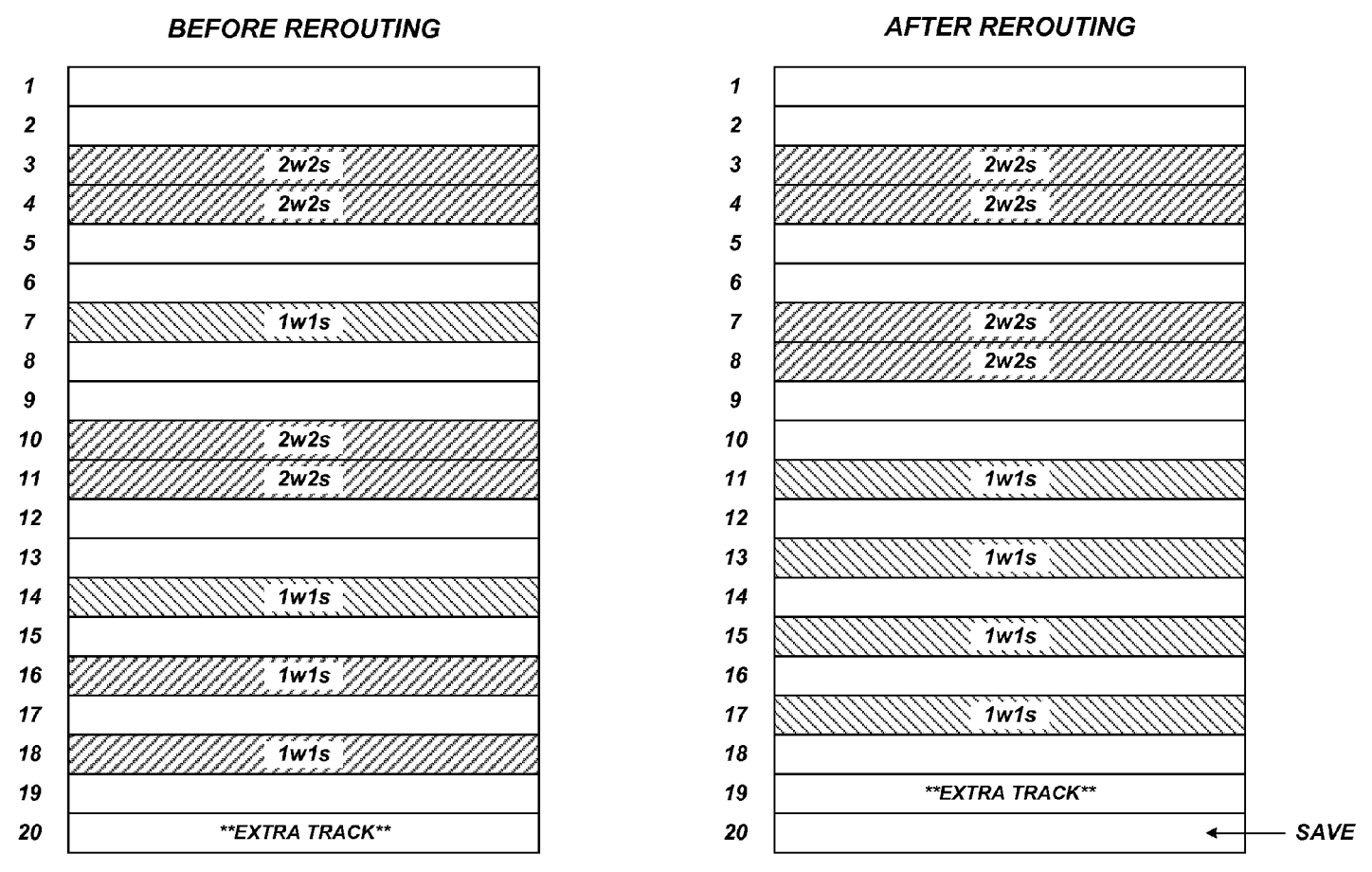

Referring now to FIG. 5, a graphical illustration of how the rerouting method 300 can address underutilization is shown, in accordance with an embodiment of the present invention. Underutilization may occur when wires assigned to a particular tile or set of tiles are routed randomly resulting in extra tracks located randomly across the particular tile or set of tiles. In the present example, a single tile with a capacity of 20 wires is depicted before and after rerouting (206). Six wires are assigned to the tile of the present example, of which two have a W20S20 wirecode and four have a W10S10 wirecode. Before rerouting, as depicted on the left hand side of the figure, the tile has one extra or spare track which is neither occupied by a wire nor reserved as a space. After rerouting, as depicted on the right hand side of the figure, one extra track is saved due to rerouting.

Before rerouting, the six wires were organized and routed in a random order irrespective of their width or spacing requirements. In the present case, this random order results in the tile being underutilized. After rerouting, the W20S20 wires are grouped and routed together, and the W10S10 wires are grouped and routed together, according to the techniques described in detail above with reference to FIGS. 2 and 3. In the present example, the W20S20 wires are routed first, from top-to-bottom, and the W10S10 wires are routed next; however, as in the above examples, the order in which each group of wires is routed is not critical. As illustrated, one extra track is saved due to rerouting. This extra track may be beneficial for any number of reasons, for example, it can be used for better spreading of wires, as a routing resource, to solve congestion in a neighboring tile, or mitigating overall congestion problems.

Figure 6:
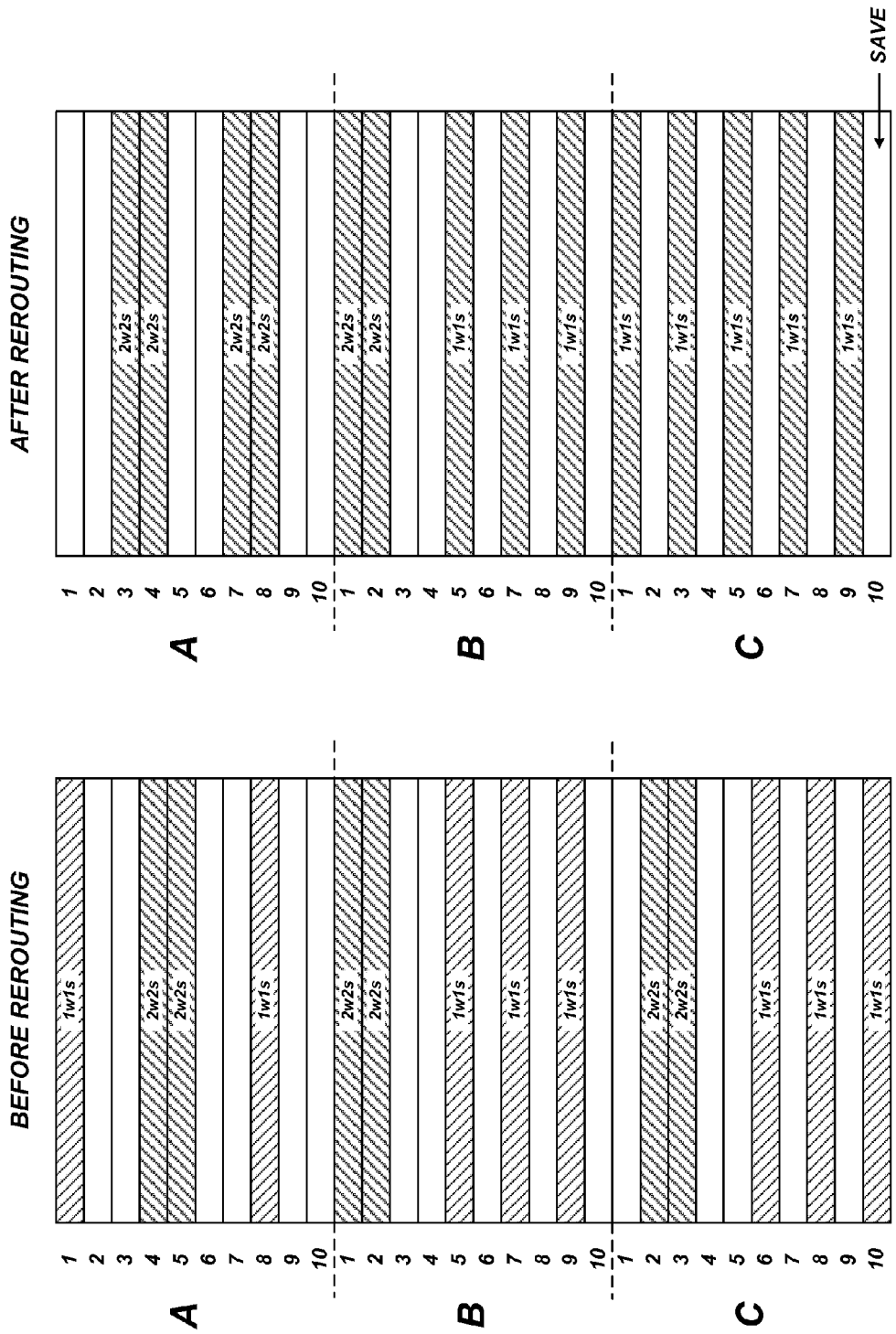
FIG. 6 illustrates a graphical illustration of the rerouting method, in accordance with an exemplary embodiment.

Referring now to FIG. 6, a graphical illustration of how the rerouting method 300 can address underutilization is shown, in accordance with an embodiment of the present invention. In the present example, three adjacent tiles, A, B, and C, each having a capacity of 10 wires are depicted before and after rerouting (206). Eleven wires are assigned across the three tiles of the present example, of which three have a W20S20 wirecode and eight have a W10S10 wirecode. Before rerouting, as depicted on the left hand side of the figure, the tiles have no extra or spare tracks. After rerouting, as depicted on the right hand side of the figure, one extra track is saved due to rerouting.

Before rerouting, the eleven wires were organized and routed in a random order irrespective of their width or spacing requirements. In the present case, this random order results in the three tiles being underutilized. After rerouting, the W20S20 wires are grouped and routed together, and the W10S10 wires are grouped and routed together, according to the techniques described in detail above with reference to FIGS. 2 and 3. In the present example, the W20S20 wires are routed first, from top-to-bottom, and the W10S10 wires are routed next; however, as in the above examples, the order in which each group of wires is routed is not critical. As illustrated, one extra track is saved due to rerouting. This extra track may be beneficial for similar reasons discussed above.

Figure 7:
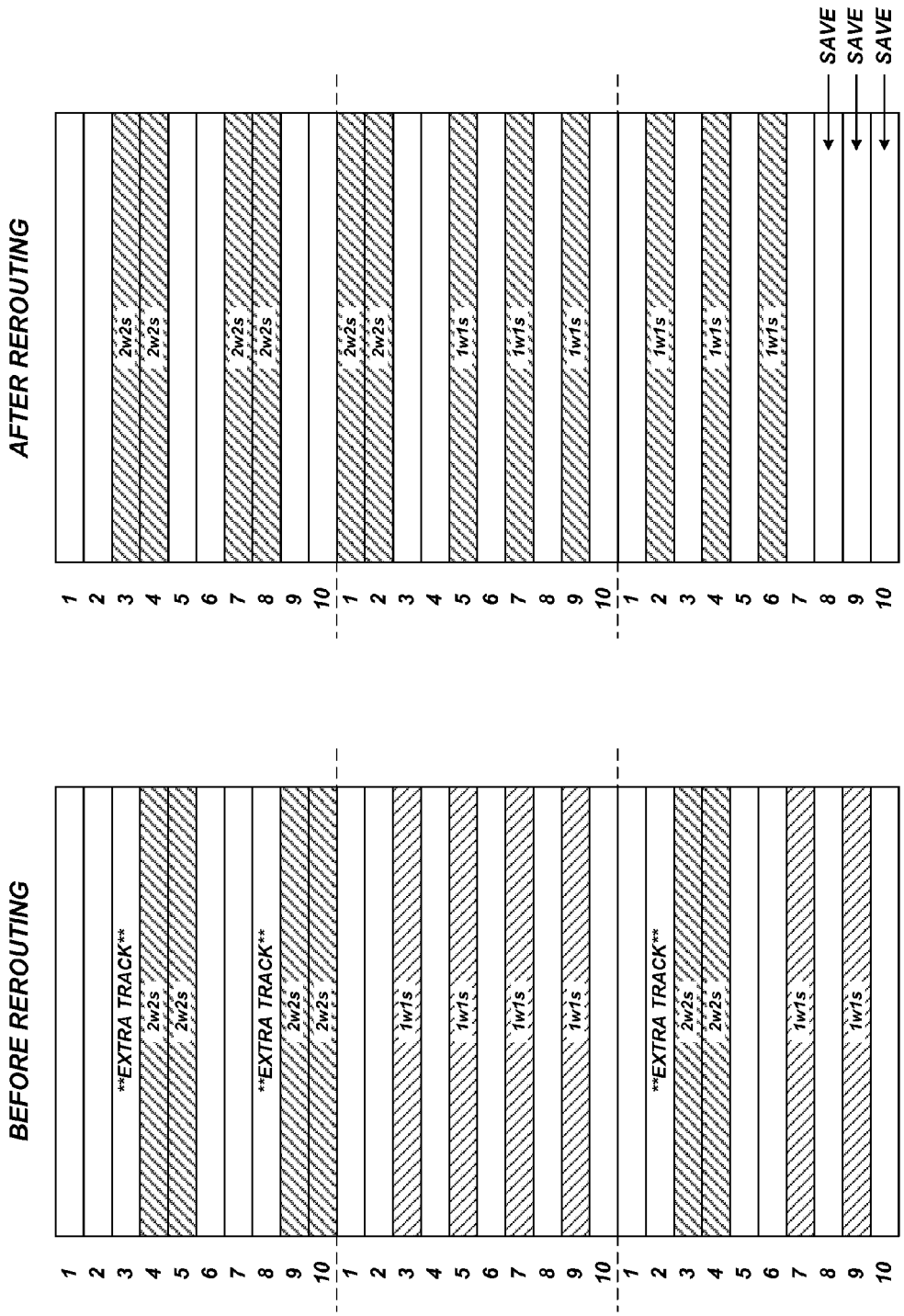
FIG. 7 illustrates a graphical illustration of the rerouting method, in accordance with an exemplary embodiment.

Referring now to FIG. 7, a graphical illustration of how the rerouting method 300 can address underutilization is shown, in accordance with an embodiment of the present invention. In the present example, three adjacent tiles, A, B, and C, each having a capacity of 10 wires are depicted before and after rerouting (206). Eleven wires are assigned across the three tiles of the present example, of which three have a W20S20 wirecode and eight have a W10S10 wirecode. Before rerouting, as depicted on the left hand side of the figure, the tiles have three extra tracks; however, these extra tracks are randomly located throughout the layout. More specifically, the extra tracks are a result of three tracks being reserved as a space adjacent to the W20S20 wires when only two are required. It should be noted that the three extra tracks cannot be utilized without violating spacing requirements of surrounding wires. After rerouting, as depicted on the right hand side of the figure, three extra tracks are saved due to rerouting.

Before rerouting, the eleven wires were organized and routed in a random order irrespective of their width or spacing requirements. In the present case, this random order results in the three tiles being underutilized. After rerouting, the W20S20 wires are grouped and routed together, and the W10S10 wires are grouped and routed together, according to the techniques described in detail above with reference to FIGS. 2 and 3. In the present example, the W20S20 wires are routed first, from top-to-bottom, and the W10S10 wires are routed next; however, as in the above examples, the order in which each group of wires is routed is not critical. As illustrated, three extra tracks are saved due to rerouting. These extra tracks may be beneficial for similar reasons discussed above.

Figure 8:
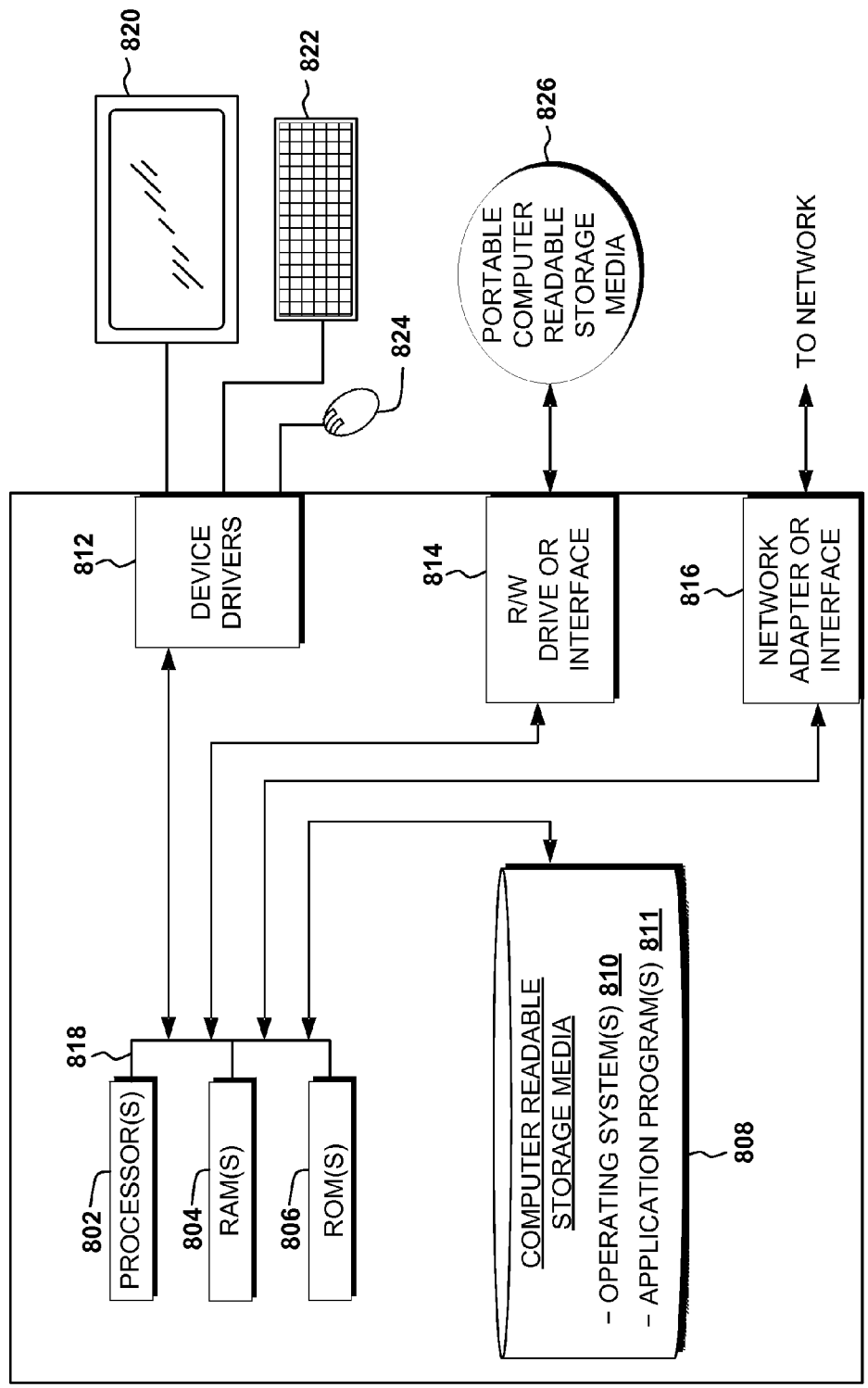
FIG. 8 is a functional block diagram of component of a computing device executing the rerouting program, in accordance with an exemplary embodiment.

Referring now to FIG. 8, a block diagram of components of a computing device, such as the client computer 102 or the server computer 104, of the system 100 of FIG. 1, in accordance with an embodiment of the present invention is shown. It should be appreciated that FIG. 8 provides only an illustration of one implementation and does not imply any limitations with regard to the environments in which different embodiments may be implemented. Many modifications to the depicted environment may be made.

The computing device may include one or more processors 802, one or more computer-readable RAMs 804, one or more computer-readable ROMs 806, one or more computer readable storage media 808, device drivers 812, read/write drive or interface 814, network adapter or interface 816, all interconnected over a communications fabric 818. Communications fabric 818 may be implemented with any architecture designed for passing data and/or control information between processors (such as microprocessors, communications and network processors, etc.), system memory, peripheral devices, and any other hardware components within a system.

One or more operating systems 810, and one or more application programs 811, for example, the rerouting program 116, are stored on one or more of the computer readable storage media 808 for execution by one or more of the processors 802 via one or more of the respective RAMs 804 (which typically include cache memory). In the illustrated embodiment, each of the computer readable storage media 808 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include a R/W drive or interface 814 to read from and write to one or more portable computer readable storage media 826. Application programs 811 on the computing device may be stored on one or more of the portable computer readable storage media 826, read via the respective R/W drive or interface 814 and loaded into the respective computer readable storage media 808.

The computing device may also include a network adapter or interface 816, such as a TCP/IP adapter card or wireless communication adapter (such as a 4G wireless communication adapter using OFDMA technology). Application programs 811 on the computing device may be downloaded to the computing device from an external computer or external storage device via a network (for example, the Internet, a local area network or other wide area network or wireless network) and network adapter or interface 816. From the network adapter or interface 816, the programs may be loaded onto computer readable storage media 808. The network may comprise copper wires, optical fibers, wireless transmission, routers, firewalls, switches, gateway computers and/or edge servers.

The computing device may also include a display screen 820, a keyboard or keypad 822, and a computer mouse or touchpad 824. Device drivers 812 interface to display screen 820 for imaging, to keyboard or keypad 822, to computer mouse or touchpad 824, and/or to display screen 820 for pressure sensing of alphanumeric character entry and user selections. The device drivers 812, R/W drive or interface 814 and network adapter or interface 816 may include hardware and software (stored on computer readable storage media 808 and/or ROM 806).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    partitioning a chip into a plurality of global routing tiles;
    assigning a set of wires to one or more of the plurality of global routing tiles;
    sorting the set of wires into one or more groups based on line spacing requirements for wires of the set of wires, wherein each of the one or more groups comprises one or more wires with a common line spacing requirement;
    organizing the one or more groups in a numeric order based on the common line spacing requirement of each group;
    routing the one or more wires within the one or more groups based on the numeric order;
    generating a final circuit design by assigning the one or more wires and their associated spaces to specific tracks within the one or more of the plurality of global routing tiles; and
    causing the final circuit design to be fabricated.

2. The method according to claim 1, wherein sorting the set of wires into the one or more groups based on the line spacing requirements for the wires of the set of wires comprises:
    sorting multiple sets of wires assigned to adjacent global routing tiles into the one or more groups based on the line spacing requirements for the wires of the set of wires.

3. The method according to claim 1, wherein a number of wires in the set of wires is greater than a number of available tracks of the one or more of the plurality of global routing tiles.

4. The method according to claim 1, wherein the line spacing requirements are directly proportional to wire size.

5. The method according to claim 1, wherein the one or more wires of the one or more groups comprises a common wire size.

6. A computer system comprising:
    one or more computer processors, one or more computer-readable storage media, and program instructions stored on the one or more computer-readable storage media for execution by at least one of the one or more computer processors, the program instructions comprising:
    program instructions to partition a chip into a plurality of global routing tiles;
    program instructions to assign a set of wires to one or more of the plurality of global routing tiles;
    program instructions to sort the set of wires into one or more groups based on line spacing requirements for wires of the set of wires, wherein each of the one or more groups comprises one or more wires with a common line spacing requirement;
    program instructions to organize the one or more groups in a numeric order based on the common line spacing requirement of each group;
    program instructions to route the one or more wires within the one or more groups based on the numeric order;
    program instructions to generate a final circuit design by assigning the one or more wires and their associated spaces to specific tracks within the one or more of the plurality of global routing tiles; and program instructions to cause the final circuit design to be fabricated.

7. The computer system according to claim 6, wherein the program instructions to sort the set of wires into the one or more groups based on the line spacing requirements for the wires of the set of wires comprises:
program instructions to sort multiple sets of wires assigned to adjacent global routing tiles into the one or more groups based on the line spacing requirements for the wires of the set of wires.

8. The computer system according to claim 6, wherein a number of wires in the set of wires is greater than a number of available tracks of the one or more of the plurality of global routing tiles.

9. The computer system according to claim 6, wherein the line spacing requirements are directly proportional to wire size.

10. The computer system according to claim 6, wherein the one or more wires of the one or more groups comprises a common wire size.

11. A computer program product comprising:
one or more computer-readable storage media and program instructions stored on the one or more computer-readable storage media, the program instructions comprising:
program instructions to partition a chip into a plurality of global routing tiles;
program instructions to assign a set of wires to one or more of the plurality of global routing tiles;
program instructions to sort the set of wires into one or more groups based on line spacing requirements for wires of the set of wires, wherein each of the one or more groups comprises one or more wires with a common line spacing requirement;
program instructions to organize the one or more groups in a numeric order based on the common line spacing requirement of each group;
program instructions to route the one or more wires within the one or more groups based on the numeric order;
program instructions to generate a final circuit design by assigning the one or more wires and their associated spaces to specific tracks within the one or more of the plurality of global routing tiles; and
program instructions to cause the final circuit design to be fabricated.

12. The computer program product according to claim 11, wherein the program instructions to sort the set of wires into the one or more groups based on the line spacing requirements for the wires of the set of wires comprises:
program instructions to sort multiple sets of wires assigned to adjacent global routing tiles into the one or more groups based on the line spacing requirements for the wires of the set of wires.

13. The computer program product according to claim 11, wherein a number of wires in the set of wires is greater than a number of available tracks of the one or more of the plurality of global routing tiles.

14. The computer program product according to claim 11, wherein the line spacing requirements are directly proportional to wire size.

15. The computer program product according to claim 11, wherein the one or more wires of the one or more groups comprises a common wire size.

* * * * *